United States Patent [19]

Layher

[11] Patent Number: 4,678,358
[45] Date of Patent: Jul. 7, 1987

[54] GLASS COMPRESSION SEALS USING LOW TEMPERATURE GLASS

[75] Inventor: Francis W. Layher, Los Gatos, Calif.

[73] Assignee: National Semiconductor Corporation, Santa Clara, Calif.

[21] Appl. No.: 754,714

[22] Filed: Jul. 15, 1985

[51] Int. Cl.[4] .............................................. C03C 27/08
[52] U.S. Cl. ..................................... 403/28; 403/404; 403/179; 65/59.31; 65/59.32; 174/152 GM
[58] Field of Search ................. 65/59.25, 59.24, 59.26, 65/59.27, 59.31, 59.32, 59.02, 59.01; 403/28, 179, 30, 272, 404; 174/152 GM, 50.61

[56] References Cited

U.S. PATENT DOCUMENTS

| | | | |
|---|---|---|---|
| 2,770,923 | 11/1956 | Dalton et al. | 403/30 |
| 3,188,720 | 6/1965 | Husni | 65/59.25 X |
| 3,302,961 | 2/1967 | Franklin | 403/372 |
| 3,370,874 | 2/1968 | Scherer et al. | 403/28 |
| 3,685,005 | 8/1972 | D'Alessandro | 174/152 GM |
| 4,029,897 | 6/1977 | Mayer et al. | 174/152 GM |
| 4,128,697 | 12/1978 | Simpson | 174/50.61 X |
| 4,417,913 | 11/1983 | Davis et al. | 65/59.1 |
| 4,430,376 | 2/1984 | Box | 65/59.1 X |

Primary Examiner—Cornelius J. Husar
Assistant Examiner—Joseph A. Fischetti
Attorney, Agent, or Firm—Gail W. Woodward

[57] ABSTRACT

A metal housing is provided with lead in members by way of a compression seal using a glass that can be worked below about 480° C. The housing and lead in members can be preplated in a low cost process to provide a suitable protective coating that is present under the glass after the seal is made. This obviates a post seal plating and therefore avoids the related problems. It also permits using aluminum as the housing material.

6 Claims, 2 Drawing Figures

U.S. Patent    Jul. 7, 1987    4,678,358
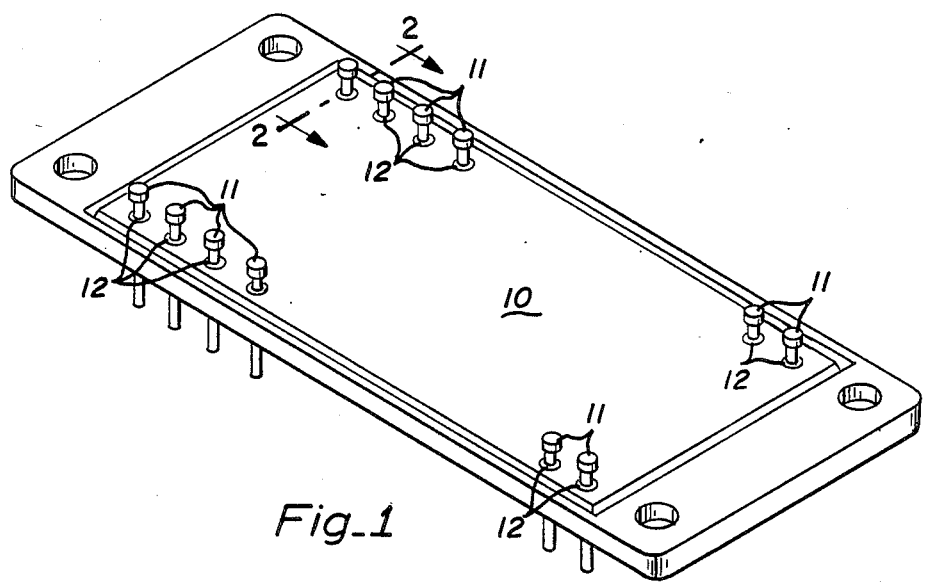
Fig_1
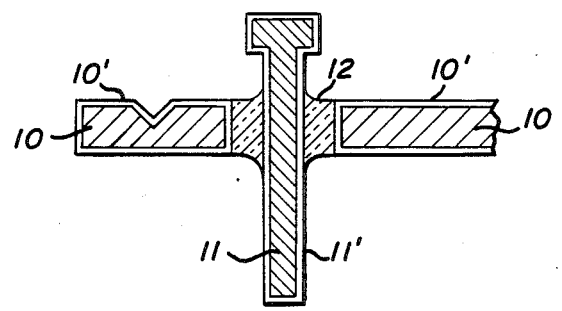
Fig_2

GLASS COMPRESSION SEALS USING LOW TEMPERATURE GLASS

BACKGROUND OF THE INVENTION

The invention relates to lead-in conductors used in hermetically sealed metal packages. Ordinarily, such lead-in conductors involve a glass insulator which holds the lead-in conductor in place and also insulates it from the metal package. A great deal of development technology has been directed toward the development of suitable glass-metal seals for use in such an application. In the so-called compression seal a glass is selected having a relatively low thermal coefficient of expansion (TCE) and is sealed inside an eyelet in a base metal having a relatively high TCE. When such a combination is cooled from the sealing temperature to low temperature, the metal shrinks more than the glass thereby placing the glass under compression. Glass is quite strong under compression so such a combination is stable. The material of the lead-in is selected to have a TCE about equal to that of the glass or slightly lower. Reference is made to U.S. Pat. No. 2,770,923 which is directed to an aluminum to glass internal seal that is under compression after the seal is completed and to a low melting glass that is workable at a temperature below the melting temperature of aluminum. U.S. Pat. No. 3,035,372 is another example of a compression seal teaching. Here a low TCE lead-in is glass sealed to an opening in a high TCE member such as SAE 1010 steel. Such a seal is made at the glass working temperature which is typically on the order of 1000° C. U.S. Pat. No. 4,349,635 is exemplary of an attempt to provide a low melting sealing glass for compression seals. A lead-free glass is mixed with powdered alumina to produce a mixture that can be sealed at 750°–800° C. This is significantly lower than the 1000° C. prior art glasses but it is still too high. For example, it precludes the use of aluminum which melts at about 660° C. The teaching contained in the above three patents is incorporated herein by reference.

The working temperature of the commonly used glasses for forming compression seals is about 1000° C. The glass described in the above-referenced U.S. Pat. No. 2,770,923 has a working temperature of about 560° C. At these working temperatures any coatings on the seal elements will tend to melt and/or interdiffuse with the base metal. Such coatings are needed to provide a metal surface which can be wire bonded or otherwise contacted to complete the electrical interconnection of the housed parts. If the coating is melted or interdiffused with the metal base its bondability can be destroyed. If applied before the seal is fired such a coating must be made unacceptably thick. Therefore, in the fabrication of hermetic metal packages it is common practice to plate the packages after they are assembled. This is costly because the parts must be handled on an individual basis and, if electroplating is employed, all of the metal parts must be electrically contacted individually. It is greatly preferred that the parts be plated prior to assembly.

SUMMARY OF THE INVENTION

It is an object of the invention to employ a low melting glass in forming the hermetic seals in metal packages that employ compression seals.

It is a further object of the invention to employ preplated parts in forming a low temperature glass seal of lead in conductors in hermetically sealed metal packages.

It is a still further object of the invention to provide a compression seal in a metal package wherein the base metal is aluminum.

These and other objects are achieved as follows. A low temperature glass is employed in making the glass seals for the lead in conductors in a metal package. Desirably, the glass is selected so that the seal can be formed below about 480° C. The metal parts are preplated with a suitable metal coating that provides the desired surface protection or property. The lead-in elements are composed of a metal that has a TCE that approximates that of the glass while the housing portion of the package is composed of a metal having a higher TCE. Thus, the lead-in elements are secured in a compression seal. Since the parts are preplated and not subjected to a working temperature that will diffuse or melt the coating, the resulting package does not need to be plated after the seal is made and prior to use.

BRIEF DESCRIPTION OF THE DRAWINGS

FIG. 1 is a front elevation view of the lead-in portion of a metal hermetic package.

FIG. 2 is a cross section of the package of FIG. 1 taken at line 2.

DESCRIPTION OF THE INVENTION

With reference to FIG. 1, base 10 represents the lead-in portion of a metal hermetic package. A metal cap (not shown) will be sealed to the periphery of base 10 to complete the package after the components to be packaged are secured to base 10. Lead-in conductors 11 are hermetically sealed into base 10 by glass compression seals 12. The lead-in conductors 11 are shown having a nail head construction. The flattened upper portion is designed to receive a wire bond (not shown) that will complete the connection to the elements to be housed. It is to be understood that while FIG. 1 shows only four lead-in conductors, any number can be located in base 10. Also, while peripheral lead-in locations are shown, they can be located anywhere in base 10 in any desired configuration. In the electronics industry it has become standard practice to locate two rows of lead in conductors along the package long dimension sides. However, this bears no relation with the invention.

FIG. 2 is a section of base 10 taken through a lead in conductor to show the seal construction. Base 10 is shown having a coating 10' and lead-in 11 is shown having a coating 11'. It is to be understood that in FIG. 2 the thickness of the coatings 10' and 11' is greatly exaggerated. As a practical matter the coatings are so thin that they would be invisible in a scale drawing. These coatings are applied to the metal parts prior to forming the glass seal. In commercial applications coatings 10' and 11' can be composed of electrolytic nickel. A nickel coating of 200 microinches ±100 microinches is preferred. In military applications the coatings can be composed of 50 microinches of gold. Silver is an alternative protective metal. Base 10 is typically composed of SAE 1008 steel which has a TCE of about $117 \times 10^{-7}$/E or it can be composed of SAE 1010 steel which has a TCE of about $117 \times 10^{-7}$/°C. I prefer that lead-in conductors 11 be composed of SAE 42 alloy which is 41% nickel and 59% iron and has a TCE of about $45 \times 10^{-7}$/°C. If desired, lead-in conductors can be composed of KOVAR ® which is an alloy of iron, nickel and cobalt having a TCE of 46-52×10$^{-7}$/°C. Glass 12 is preferred to be LSO113 glass available from Nippon Electric Glass Company. It is a vitreous solder glass having a TCE of about 64×10$^{-7}$/°C. and a sealing temperature of 445° to 480° C. This glass also has the capability of wetting the metals to be used in coating of the metal parts when the glass is heated to sealing temperature. An alternative glass identified as SG350 is available from Owens-Illinois Corporation of Toledo, Ohio.

The sealing process operates as follows. The metal parts are fabricated to the desired shape and then electroplated with a suitable coating metal (nickel, silver or gold) as descibed above. Conventional barrel plating can be employed. The plated parts are located in a suitable jig (not shown) and the solder glass applied in powder (sintered) form. It is to be noted that due to the low melting temperature of the solder glass and the attendant low temperature sealing operation, the jig can be made of low cost metal rather than the expensive graphite or ceramic jig required in the prior art process. The seal is then fired at 445° to 480° C. for 8-10 minutes. The firing atmosphere can be nonoxidizing, such as nitrogen or helium. It is not necessary to use a reducing or fluxing atmosphere, such as hydrogen or forming gas, but such atmospheres can be employed as desired. During firing the glass melts, adheres to the metal coating, and forms a small meniscus on the lead-in face as shown in FIG. 2. After firing and glass sealing the assembly cools. The base 10 metal contracts more than the glass thereby placing the seal in compression. The resulting compression seal provides hermetically sealed and coated lead-in conductors in a coated steel base.

One of the major advantages of the above process is that the assembly does not require plating after the seals are made. Such a plating operation ordinarily requires handling because the assembly must be located on a plating rack that makes electrical connection to each lead-in as well as the base. (It is noted that in most cases the plating must be electrolytic.) In military applications electroplating is mandated. The handling increases the assembly cost and inevitably results in damaging some of the parts. Another benefit relates to the corrodability of the finished product. In the prior art assembly, where the plating must occur after the glass seal, any subsequent flexing of the leads will produce small glass chips where the lead-in joins the glass. Such chipping will not harm the assembly, which would otherwise still be usable, but the chipping will expose the underlying uncoated metal to the atmosphere thereby creating a corrosion site. In other words, since the protective coating does not exist under the glass, the potential for creating corrosion sites is much greater. Using the invention where the parts are preplated, the protective coating exists under the glass and minor glass chipping will not expose the underlying metal so as to avoid creating a corrosion site.

If desired, the steel base 19 can be replaced by aluminum. This is feasible because the seal firing temperature is well below the aluminum melting temperature. Aluminum is a desirable housing material because of its high thermal conductivity and its capability of being cold welded. If aluminum is employed in fabricating base 10 it is preplated as described above. However, it is preferred that the coating be removed inside the lead-in holes prior to glass sealing. This means that the glass seals to the aluminum rather than to the coating. The coating can be removed by mechanical means such drilling or reaming just prior to assembling the parts in the jig.

The invention has been described in terms of the structure and the process for making it. When a person skilled in the art reads the foregoing description, alternatives and equivalents, within the spirit and intent of the invention, will be apparent. Accordingly, it intended that the scope of the invention be limited only by the following claims.

I claim:

1. A glass to metal compression seal for accommodating hermetically sealed lead-in conductors in a metal housing, said seal comprising:
    a housing consisting of a metal shell having apertures located therein where said lead-in conductors are to be established;
    a preplated lead-in conductor extending through each of said apertures; and
    a low melting sealing glass, having a working temperature approximately below 480° C., located in said apertures and surrounding said lead-in conductors so as to mechanically secure them in hermetic relationship to said housing, said sealing glass having a thermal coefficient of expansion that is substantially lower than that of said metal shell whereby said seal is under compression after its formation.

2. The compression seal of claim 1 wherein said metal shell, including said apertures, is preplated.

3. The compression seal of claim 2 wherein said preplated coatings are selected from the group consisting of nickel, gold and silver.

4. The compression seal of claim 1 wherein the thermal coefficient of expansion of said lead-in conductors is close to that of said sealing glass.

5. The compression seal of claim 1 wherein said housing is composed of steel.

6. The compression seal of claim 1 wherein said housing is composed of aluminum.

* * * * *